(12) United States Patent
Narita

(10) Patent No.: US 10,193,538 B2
(45) Date of Patent: *Jan. 29, 2019

(54) SEMICONDUCTOR DEVICE

(71) Applicant: RENESAS ELECTRONICS CORPORATION, Tokyo (JP)

(72) Inventor: Koki Narita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/473,964

(22) Filed: Mar. 30, 2017

(65) Prior Publication Data

US 2017/0207775 A1   Jul. 20, 2017

Related U.S. Application Data

(63) Continuation of application No. 15/170,557, filed on Jun. 1, 2016, now Pat. No. 9,647,647.

(30) Foreign Application Priority Data

Aug. 10, 2015 (JP) ................................ 2015-158023

(51) Int. Cl.
*H03K 5/08* (2006.01)
*H03K 19/003* (2006.01)

(52) U.S. Cl.
CPC ......... *H03K 5/08* (2013.01); *H03K 19/00315* (2013.01)

(58) Field of Classification Search
None
See application file for complete search history.

(56) References Cited

U.S. PATENT DOCUMENTS 8,169,761 B2 * 5/2012 Yeh ..................... H01L 27/0266
361/111
9,647,647 B2 * 5/2017 Narita ...................... H03K 5/08
(Continued)

FOREIGN PATENT DOCUMENTS

JP   2006-100606 A   4/2006

OTHER PUBLICATIONS

Notice of Allowance dated Jan. 3, 2017, issued in U.S. Appl. No. 15/170,557.

*Primary Examiner* — Long Nguyen
(74) *Attorney, Agent, or Firm* — McDermott Will & Emery LLP

(57) ABSTRACT

A semiconductor device includes a first circuit block that is connected between a first power supply voltage line and a first reference voltage line, a second circuit block that is connected between a second power supply voltage line and a second reference voltage line and transmits and receives signals with the first circuit block, a first clamp circuit that clamps a potential difference between the second power supply voltage line and the first reference voltage line, a resistor circuit that is connected between the second power supply voltage line and the second circuit block and includes a resistance value that is greater than an impedance of the first clamp circuit, and a second clamp circuit that clamps a potential difference between a line connected between the resistor circuit and the second circuit block and the first reference voltage line.

15 Claims, 12 Drawing Sheets

(56) References Cited

U.S. PATENT DOCUMENTS

| | | | |
|---|---|---|---|
| 2006/0077601 A1* | 4/2006 | Ikeda | H01L 27/0251 |
| | | | 361/56 |
| 2013/0114172 A1* | 5/2013 | Huang | H02H 3/20 |
| | | | 361/56 |
| 2015/0124362 A1* | 5/2015 | Huang | H02H 3/20 |
| | | | 361/56 |

* cited by examiner

THE NUMBER OF DIODES CONNECTED IN SERIES HAVING ANODES CONNECTED TO VDDM IS ADJUSTED ACCORDING TO VOLTAGE VALUE OF VDDM (1) TYPE 1

(2) TYPE 2

(3) TYPE 3

(4) TYPE 1

(5) TYPE 2

(6) TYPE 3

SEMICONDUCTOR DEVICE

CROSS-REFERENCE TO RELATED APPLICATIONS

This application is a continuation of U.S. application Ser. No. 15/170,557 filed Jun. 1, 2016, which is based upon and claims the benefit of priority from Japanese patent application No. 2015-158023, filed on Aug. 10, 2015, the disclosures of which are incorporated herein in their entirety by reference.

BACKGROUND

The present invention relates to a semiconductor device, and to, for example, a semiconductor device that includes a circuit for transmitting and receiving signals between different power supplies.

Charged Device Model (CDM) is one of electrostatic discharge models in semiconductor chips. A CDM withstand voltage is evaluated by a test method in which a whole semiconductor chip is charged, and a GND (metal) terminal is brought into contact with a test pin to discharge.

In an advanced process, miniaturization promotes thinning of gate oxide films of MOS transistors, and thus a reduction in a gate withstand voltage becomes prominent. Therefore, chances in which a gate breakdown occurs in a MOS transistor (in particular, a MOS transistor that receives a different power supply crossing signal on a semiconductor chip on which analog and digital circuits are mounted and that supplies different power supplies respectively to the analog and digital circuits) at the time of testing electrostatic discharge (especially at the time of a CDM test) for evaluating Electro-Static Discharge (ESD) resistance. Hereinafter, in such a semiconductor chip, a region occupied by a digital circuit shall be referred to as a "core logic region", and a region occupied by an analog circuit shall be referred to as an "analog IP region".

An analog power supply that is supplied to an analog circuit inside an analog IP (Intellectual Property) region is often electrically separated from a digital power supply for the purpose of avoiding noise propagated from the digital power supply that is supplied to a digital circuit inside a core logic region. However, the separation between the digital and analog power supplies often works against ESD, especially at the time of a CDM test, due to the following factors (1) and (2).
(1) A capacitance between a power supply voltage line and a reference voltage line (a ground line) in the analog IP region is smaller than that in the core logic region.
(2) A package capacitance added to the analog IP region at the time of a CDM test is smaller than a package capacitance added to the core logic region.

This is because that a size of the analog circuit in the analog IP region is smaller than that of the digital circuit in the core logic region. As described above, in most cases, a requested size of the analog circuit is smaller than that of the digital circuit. At the time of a CDM test, most of a surge current flowing from a terminal is considered to be passed to the core logic region with a greater package capacitance, especially to the reference voltage line. At the time of a CDM test on an analog power supply terminal, as a CDM current flows from the terminal to the reference voltage line in the core logic region through a plurality of protection elements, a potential difference generated in a circuit part that transmits a different power supply crossing signal between the core logic region and the analog IP region (the circuit part is hereinafter referred to as a "different power supply crossing part") is likely to be great, and thus a gate breakdown can easily occur. Accordingly, in such a semiconductor chip, it is desired to incorporate a mechanism that improves an ESD resistance of the different power supply crossing part, which is a weak point in the CDM test.

Japanese Unexamined Patent Application Publication No. 2006-100606 discloses a semiconductor device that can prevent electrostatic discharge events generated between a plurality of power supplies, especially electrostatic discharge events by CDM, with a small number of protection circuits. This semiconductor device includes a circuit block that operates according to a first power supply voltage and a first reference voltage and circuit block that operates according to a second power supply voltage and a second reference voltage. The semiconductor device includes a clamp circuit that clamps a potential difference between the first power supply voltage and the second reference voltage, a clamp circuit that clamps a potential difference between the second power supply voltage and the first reference voltage, and a clamp circuit that clamps a potential difference between the first reference voltage and the second reference voltage.

SUMMARY

However, in the technique disclosed in Japanese Unexamined Patent Application Publication No. 2006-100606, when a withstand voltage of a protected element is reduced due to process miniaturization or the like, there is no other measures than increasing sizes of the clamp circuits in order to reduce clamp voltages between power supplies and grounds. However, the present inventor has found a problem that an increase in the size of the clamp circuit leads to an increase in an area (i.e., cost) of a semiconductor chip.

Other problems of the related art and new features of the present invention will become apparent from the following descriptions of the specification and attached drawings.

According to an aspect, a semiconductor device includes: a first clamp circuit that clamps a potential difference between a second power supply voltage line and a first reference voltage line; a resistor circuit that is connected between the second power supply voltage line and a second circuit block that transmits and receives signals with the first circuit block; and a second clamp circuit that clamps a potential difference between a line connected between the resistor circuit and the second circuit block and the first reference voltage line.

According to the above aspect, it is possible to improve ESD resistance while preventing the cost of a semiconductor device from rising.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
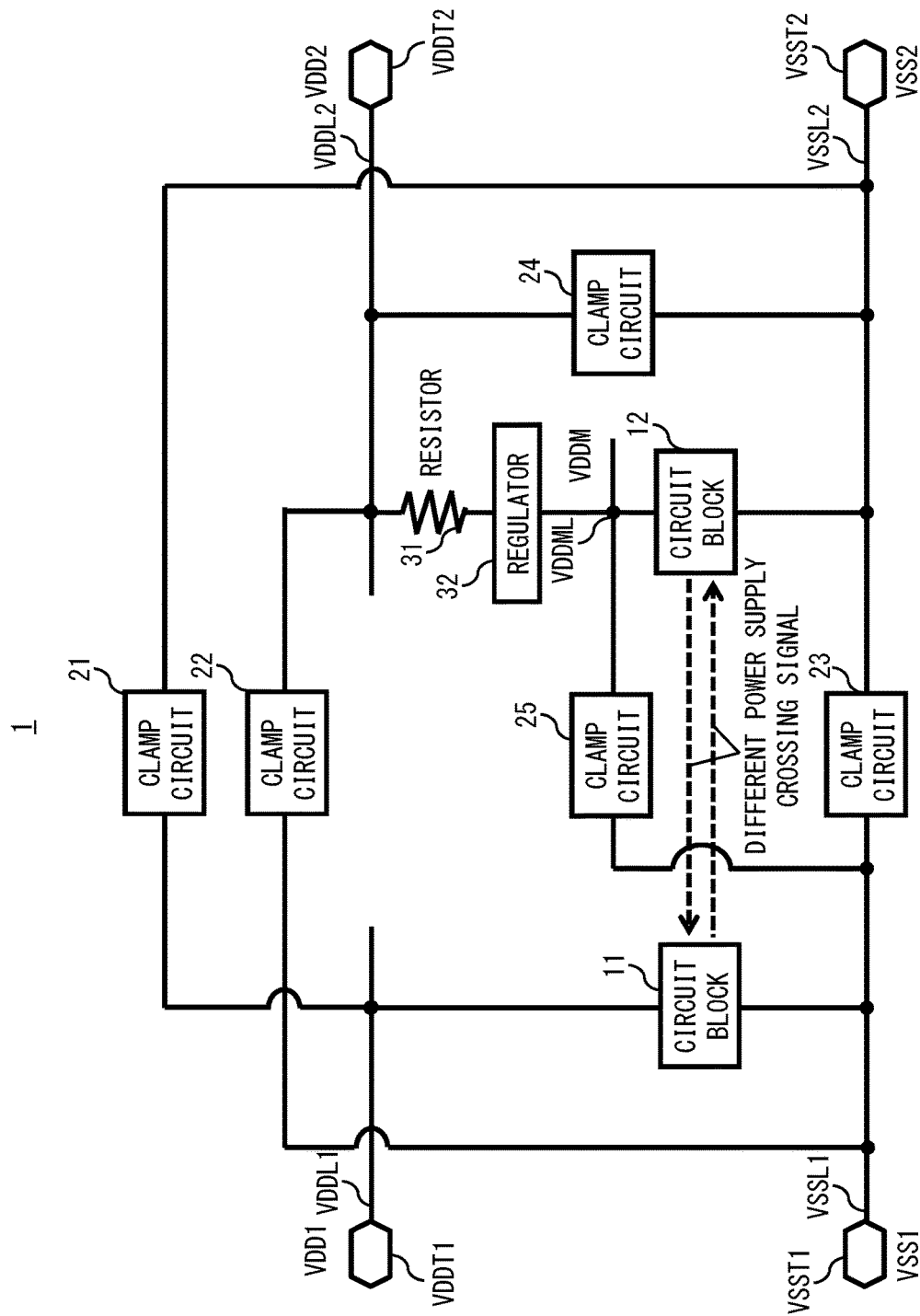
FIG. 1 is a drawing showing a circuit configuration of a semiconductor chip according to a first embodiment.

Hereinafter, preferable embodiments will be described with reference to the drawings. Specific numeric values shown in the following embodiment are merely illustrative for easier understanding of the embodiments, and unless otherwise particularly specified, the present invention is not limited to them. Further, in the following descriptions and drawings, matters obvious to those skilled in the art are omitted and simplified as appropriate for clarity of the descriptions First Embodiment Configuration of First Embodiment A first embodiment will be described below. Firstly, a circuit configuration of a semiconductor chip 1 according to the first embodiment will be described with reference to FIG. 1. As shown in FIG. 1, the semiconductor chip 1 includes circuit blocks 11 and 12, clamp circuits 21 to 25, a resistor 31, and a regulator 32. The semiconductor chip 1 further includes a power supply voltage terminal VDDT1, a power supply voltage terminal VDDT2, a reference voltage terminal VSST1, a reference voltage terminal VSST2, a power supply voltage line VDDL1, a power supply voltage line VDDL2, a reference voltage line VSSL1, and a reference voltage line VSSL2.

A power supply voltage VDD1 is supplied from the power supply voltage terminal VDDT1 to the power supply voltage line VDDL1. A power supply voltage VDD2 is supplied from the power supply voltage terminal VDDT2 to the power supply voltage line VDDL2. A reference voltage VSS1 is supplied from the reference voltage terminal VSST1 to the reference voltage line VSSL1. A reference voltage VSS2 is supplied from the reference voltage terminal VSST2 to the reference voltage line VSSL2.

The circuit block 11 is connected between the power supply voltage line VDDL1 and the reference voltage line VSSL1. The circuit block 11 operates according to the power supply voltage VDD1 supplied from the power supply voltage line VDDL1 and the reference voltage VSS2 supplied from the reference voltage line VSSL1.

The circuit block 12 is connected between the power supply voltage line VDDL2 and the reference voltage line VSSL2. The circuit block 12 operates according to the power supply voltage VDD2 supplied from the power supply voltage line VDDL2 and the reference voltage VSS2 supplied from the reference voltage line VSSL2.

To be more specific, the circuit block 12 is connected to the power supply voltage line VDDL2 with the resistor 31 and the regulator 32 interposed therebetween. That is, to be more precise, the circuit block 12 operates according to an internal voltage VDDM, which is obtained by reducing the power supply voltage VDD2 by the resistor 31 and the regulator 32, and the reference voltage VSS2.

That is, the circuit blocks 11 and 12 operate according to power supplies that are different from each other. The circuit blocks 11 and 12 are connected by a signal line and transmit and receive signals with each other. Hereinafter, these signals will also be referred to as "different power supply crossing signals". Each of the circuit blocks 11 and 12 includes a MOS transistor (not shown) that receives the different power supply crossing signals. Each of the circuit blocks 11 and 12 includes a CMOS inverter circuit that is comprised of, for example, a PMOS transistor (p-channel MOS transistor) and an NMOS transistor (n-channel MOS transistor). By the CMOS inverter circuit, one of the circuit blocks 11 and 12 obtains a value according to a value of the different power supply crossing signal output from the other one of the circuit blocks 11 and 12. In the first embodiment, a gate breakdown in the MOS transistor can be avoided by a mechanism described later. In other words, the first embodiment improves ESD resistance in a different power supply crossing part by the mechanism described later.

The clamp circuit 21 is connected between the power supply voltage line VDDL1 and the reference voltage line VSSL2. The clamp circuit 21 clamps a potential difference generated between the power supply voltage line VDDL1 and the reference voltage line VSSL2 when ESD is applied. The clamp circuit 21 is, for example, an NMOS clamp circuit that includes an RC timer trigger circuit, as will be described in detail with reference to FIG. 2.

The clamp circuit 22 is connected between the power supply voltage line VDDL2 and the reference voltage line VSSL1. The clamp circuit 22 clamps a potential difference generated between the power supply voltage line VDDL2 and the reference voltage line VSSL1 when ESD is applied. The clamp circuit 22 is, for example, an NMOS clamp circuit that includes an RC timer trigger circuit, as will be described in detail with reference to FIG. 2.

The clamp circuit 23 is connected between the reference voltage line VSSL1 and the reference voltage line VSSL2. The clamp circuit 23 clamps a potential difference generated between the reference voltage line VSSL1 and the reference voltage line VSSL2 when ESD is applied. The clamp circuit 23 is, for example, a bidirectional diode.

The clamp circuit 24 is connected between the power supply voltage line VDDL2 and the reference voltage line VSSL2. The clamp circuit 24 clamps a potential difference generated between the power supply voltage line VDDL2 and the reference voltage line VSSL2 when ESD is applied. The clamp circuit 24 is, for example, an NMOS clamp circuit that includes an RC timer trigger circuit, as will be described in detail with reference to FIG. 2.

The clamp circuit 25 is connected between a line that is between the regulator 32 and the circuit block 12 and the reference voltage line VSSL1. The clamp circuit 25 clamps a potential difference generated between the line that is between the regulator 32 and the circuit block 12 and the reference voltage line VSSL1 when ESD is applied. The clamp circuit 25 is, for example, a bidirectional diode, which will be described in detail with reference to FIG. 3. An opposing length of this bidirectional diode is, for example, about 10 to 20 um. Note that to simplify the description, the line between the regulator 32 and the circuit block 12 will also be referred to as an "internal line VDDML".

The resistor 31 is a circuit including a predetermined resistance value (excluding a resistance value of only a wiring resistance). The resistor 31 includes a resistance value of, for example, several hundreds Q. The regulator 32 is a circuit that reduces a voltage from the resistor 31 and supplies the reduced voltage to the circuit block 12. The regulator 32 includes a resistance value of several hundreds Q when ESD is applied. Note that in FIG. 1, although an example in which the resistor 31 and the regulator 32 are connected in series in this order from the power supply voltage line VDDL2 to the reference voltage line VSSL2 is shown, it is not limited to this and the resistor 31 and the regulator 32 may instead be connected in the order opposite to the above order. In this case, the internal line VDDML is a line between the resistor 31 and the circuit block 12.

With such a configuration, the semiconductor chip 1 protects the circuit blocks 11 and 12 when a surge of static electricity or the like is applied to the semiconductor chip 1 by discharging the surge through a discharge path, which will be described next.

(1) Power Supply Voltage Line VDDL1-Clamp Circuit 21-Reference Voltage Line VSSL2

For example, when a positive polarity surge voltage is applied to the power supply voltage line VDDL1, the clamp circuit 21 discharges a surge current from the power supply voltage line VDDL1 to the reference voltage line VSSL2 in order to clamp a potential difference generated between the power supply voltage line VDDL1 and the reference voltage line VSSL2.

(2) Power Supply Voltage Line VDDL2-Clamp Circuit 22-Reference Voltage Line VSSL1

For example, when a positive polarity surge voltage is applied to the power supply voltage line VDDL2, the clamp circuit 22 discharges a surge current from the power supply voltage line VDDL2 to the reference voltage line VSSL1 in order to clamp a potential difference generated between the power supply voltage line VDDL2 and the reference voltage line VSSL1.

(3) Reference Voltage Line VSSL2-Clamp Circuit 23-Reference Voltage Line VSSL1

For example, when a positive polarity surge voltage is applied to the power supply voltage line VDDL2, and a surge current is discharged from the power supply voltage line VDDL2 to the reference voltage line VSSL2 by the clamp circuit 24, a voltage of the reference voltage line VSSL2 increases. In this case, the clamp circuit 23 discharges the surge current from the reference voltage line VSSL2 to the reference voltage line VSSL1 in order to clamp a potential difference generated between the reference voltage line VSSL2 and the reference voltage line VSSL1.

(4) Power Supply Voltage Line VDDL2-Clamp Circuit 24-Reference Voltage Line VSSL2

For example, when a positive polarity surge voltage is applied to the power supply voltage line VDDL2, the clamp circuit 24 discharges a surge current from the power supply voltage line VDDL2 to the reference voltage line VSSL2 in order to clamp a potential difference generated between the power supply voltage line VDDL2 and the reference voltage line VSSL2.

(5) Internal Line VDDML-Clamp Circuit 25-Reference Voltage Line VSSL1

For example, when a positive polarity surge voltage is applied to the power supply voltage line VDDL2, and a voltage of the internal line VDDML increases, the clamp circuit 25 discharges a surge current from the internal line VDDML to the reference voltage line VSSL1 in order to clamp a potential difference generated between the internal VDDML line and the reference voltage line VSSL1.

Accordingly, the semiconductor chip 1 includes the following three discharge paths as discharge paths for clamping a potential difference between the power supply voltage line VDDL2 and the reference voltage line VSSL1. Although details of the discharge paths will be described in the description of an operation of the embodiment, the following items 1 and 2 are main paths for passing large ESD, and the item 3 is a secondary path for dividing and reducing a voltage applied to the different power supply crossing part.

1. The discharge path described in the above (2)
2. The discharge paths described in the above (4)+(3)
3. The discharge path described in the above (5)

Figure 2:
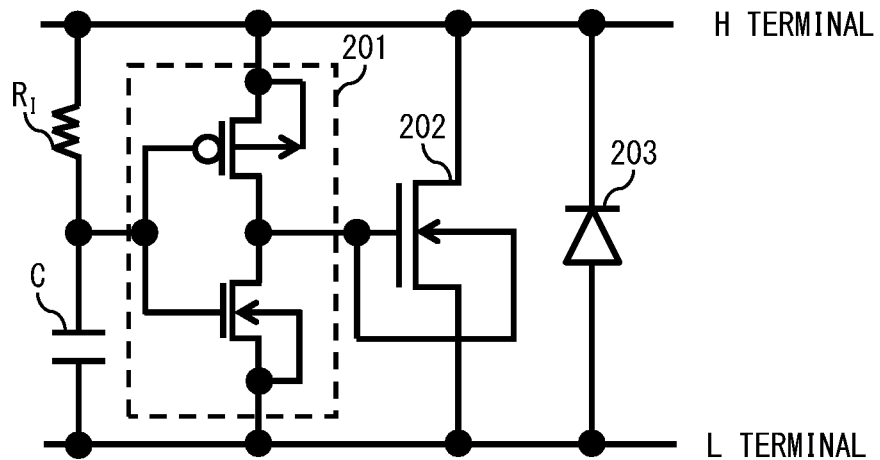
FIG. 2 is a drawing showing a circuit configuration of a clamp circuit according to the first embodiment.

Next, circuit configurations of the clamp circuits 21, 22, and 24 will be described with reference to FIG. 2. As shown in FIG. 2, each of the clamp circuits 21, 22, and 24 includes a resistor $R_I$, a capacitor C, a CMOS inverter circuit 201, an NMOS transistor 202, and a diode 203.

Further, each of the clamp circuits 21, 22, and 24 includes an H terminal and an L terminal. In the case of the clamp circuit 21, the H terminal is connected to the power supply voltage line VDDL1, and the L terminal is connected to the reference voltage line VSSL2. In the case of the clamp circuit 22, the H terminal is connected to the power supply voltage line VDDL2, and the L terminal is connected to the reference voltage line VSSL1. In the case of the clamp circuit 24, the H terminal is connected to the power supply voltage line VDDL2, and the L terminal is connected to the reference voltage line VSSL2.

The resistor $R_I$ and the capacitor C are connected in series between the H terminal and the L terminal. The resistor $R_I$ is connected to a side closer to the H terminal, while the capacitor C is connected to a side closer to the L terminal.

In the CMOS inverter circuit 201, an input terminal is connected to a line that connects the resistor $R_I$ to the capacitor C, and an output terminal is connected to the gate and the well of the NMOS transistor 202. As for the NMOS transistor 202, the drain is connected to the H terminal, and the source is connected to the L terminal. As for the diode 203, the cathode is connected to the H terminal, and the anode is connected to the L terminal.

When a relatively small positive polarity surge voltage is applied to the H terminal, an input voltage of the CMOS inverter circuit 201 gradually increases by a time constant of the resistor $R_I$ and the capacitor C. In a period when the input voltage of the CMOS inverter circuit 201 is "Low" while the input voltage is increasing, an output voltage of the CMOS inverter circuit 201 (an input voltage of the NMOS transistor 202) becomes "High", and thus the NMOS transistor 202 is turned on, and a surge current can be passed from the H terminal to the L terminal. When a relatively large surge voltage is applied to the H terminal, the above operation is performed, and further, a parasitic bipolar transistor (not shown) of the NMOS transistor 202 is turned on, and then a surge current can be passed from the H terminal to the L terminal.

On the other hand, when a negative polarity surge voltage is applied to the H terminal, a surge current can be passed from the L terminal to the H terminal by the diode 203.

Figure 3:
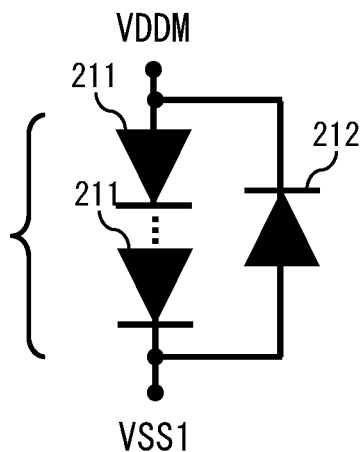
FIG. 3 is a drawing showing a circuit configuration of another clamp circuit according to the first embodiment.

Next, a circuit configuration of the clamp circuit 25 according to the first embodiment will be described with reference to FIG. 3. As shown in FIG. 3, the clamp circuit 25 includes a plurality of diodes 211 and a diode 212.

The plurality of diodes 211 are connected in series between the internal line VDDML and the reference voltage line VSSL1. The cathodes of the plurality of diodes 211 are connected to a side closer to the reference voltage line VSSL1, and the anodes of the plurality of diodes 211 are connected to a side closer to the internal line VDDML.

The cathode of the diode 212 is connected to the side closer to the internal line VDDML, and the anode of the diode 212 is connected to the side closer to the reference voltage line VSSL1.

When potential differences between the anodes of the respective plurality of diodes 211 and the diode 212 and the cathodes of the respective plurality of diodes 211 and the diode 212 exceed a predetermined threshold, a current is passed from the anodes to the cathodes. The number of stages of the plurality of diodes 211 (i.e., the number of the plurality of diodes 211) is determined according to a potential difference between the internal voltage VDDM and the reference voltage VSS1 so that a leak current will not be passed from the internal power supply VDDM to the reference voltage VSS1 in a normal operation. To be more specific, the number of stages of the plurality of diodes 211 is determined so that a threshold Vf of the diode 211x the number of stages of the plurality of diodes 211 will not be lower than (the voltage value VDDM−the reference voltage VSS1).

Then, for example, when a positive polarity surge voltage is applied to the power supply voltage line VDDL2, and a potential difference between the internal line VDDML and the reference voltage line VSSL1 exceeds the threshold Vf of the diode 211x the number of stages of the diodes 211, a surge current is passed from the internal line VDDML to the reference voltage line VSSL1 through the plurality of diodes 211. That is, the potential difference between the internal line VDDML and the reference voltage line VSSL1 is clamped.

As another example, when a negative polarity surge voltage is applied to the power supply voltage line VDDL2, and a potential difference between the reference voltage line VSSL1 and the internal line VDDML exceeds the diode 212, a surge current flows from the reference voltage line VSSL1 to the internal line VDDML through the diode 212, and the potential difference between the reference voltage line VSSL1 and the internal line VDDML is clamped.

Note that the clamp circuit 23 is configured to include, for example, one each of the diode 211 and the diode 212.

Operation of First Embodiment

Figure 4A:
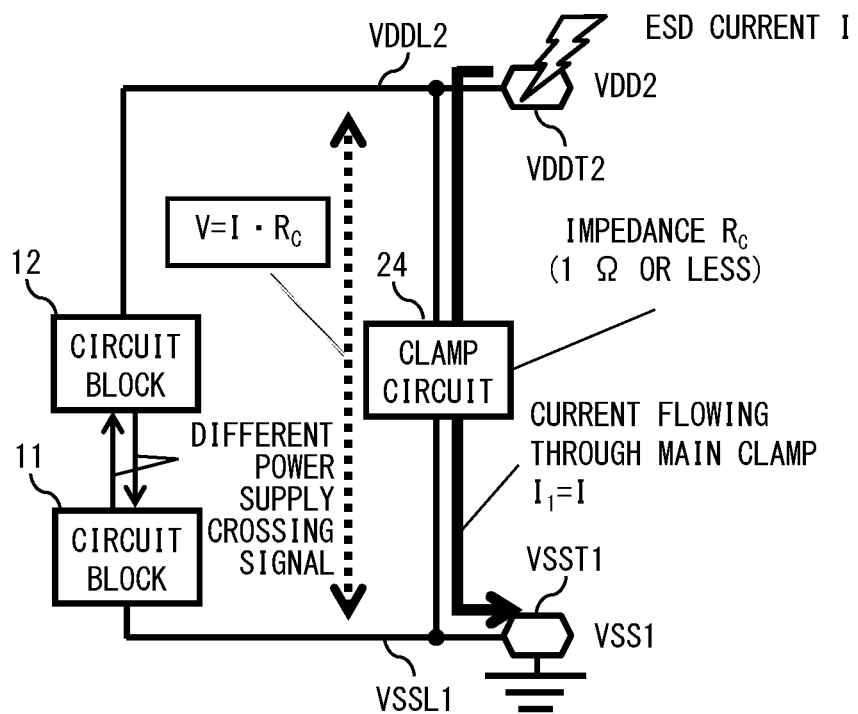
FIG. 4A is a drawing showing an operation of a semiconductor chip according to a comparative example.

Next, an operation of the semiconductor chip 1 according to the first embodiment will be described with reference to FIGS. 4A and 4B. In order to clarify advantages of the first embodiment, a comparison between a case in which the clamp circuit 25 according to the first embodiment is not used (FIG. 4A) and a case when the clamp circuit 25 according to the first embodiment is used (FIG. 4B) is used for the description of the advantages of the first embodiment.

Firstly, the case in which the clamp circuit 25 according to the first embodiment is not used will be described with reference to FIG. 4A. When a surge voltage by ESD is applied to the power supply voltage terminal VDDT2, a surge current (ESD current) I is passed to the reference voltage terminal VSST1 through the clamp circuit 24 that is connected between the power supply voltage line VDDL2 and the reference voltage line VSSL1.

When an impedance of the clamp circuit 24 is $R_C$, a potential difference generated between the power supply voltage line VDDL2 and the reference voltage line VSSL1 is $I \cdot R_C$. The potential difference $I \cdot R_C$ generated between the power supply voltage line VDDL2 and the reference voltage line VSSL1 is applied as it is to the different power supply crossing part between the circuit blocks 11 and 12 (hereinafter also referred to a "protected part").

Next, the case in which the clamp circuit 25 according to the first embodiment is used will be described with reference to FIG. 4B. When the reference voltage line VSSL1 is used as a reference, and a surge voltage by ESD is applied to the power supply voltage terminal VDDT1, a surge current is passed to the reference voltage terminal VSST1 through the two discharge paths. A first discharge path is a path passing through the clamp circuit 24 connected between the power supply voltage line VDDL2 and the reference voltage line VSSL1 (hereinafter also referred to as a "main path"). A second discharge path is a path passing through a protective resistor 31, the regulator 32, and the clamp circuit 25 that are connected between the power supply voltage line VDDL2 and the reference voltage line VSSL1 (hereinafter also referred to as a "secondary path").

A current ratio between currents flowing through the main path and the secondary path is determined by an impedance ratio of the two paths according to the Ohm's law. In order to reduce the potential difference generated when ESD is applied to be as low as possible, the main path is commonly designed with a low impedance, and an impedance $R_C$ of the clamp circuit 24 included in the main path when ESD is applied is also commonly designed with a low impedance (e.g., less than or equal to 1Ω). On the other hand, as a resistance value R of the protective resistor (the resistor 31 and the regulator 32) included in the secondary path is, for example, several hundreds Ω, the secondary path has an impedance higher than that of the main path.

Accordingly, most of the surge current I is passed to the main path (i.e., the current passing through the main path $I_1 \approx I$). Thus, a potential difference generated between the power supply voltage line VDDL2 and the reference voltage line VSSL1 will be almost the same as the potential difference $I \cdot R_C$ shown in the case of FIG. 4A. However, the protected part is connected to the power supply voltage line VDDL2 with the protective resistor (the resistor 31 and the regulator 32) interposed therebetween. Therefore, when the current flowing through the secondary path is $I_2$, a potential difference applied to the protected part is $(I \cdot R_C - I_2 \cdot R)$, which is obtained by reducing $(I_2 \cdot R)$ from the potential difference $I_2 \cdot R_C$ in the case of FIG. 4A, in which the reduction is made by the protective resistor (the resistor 31 and the regulator 32).

Figure 4B:
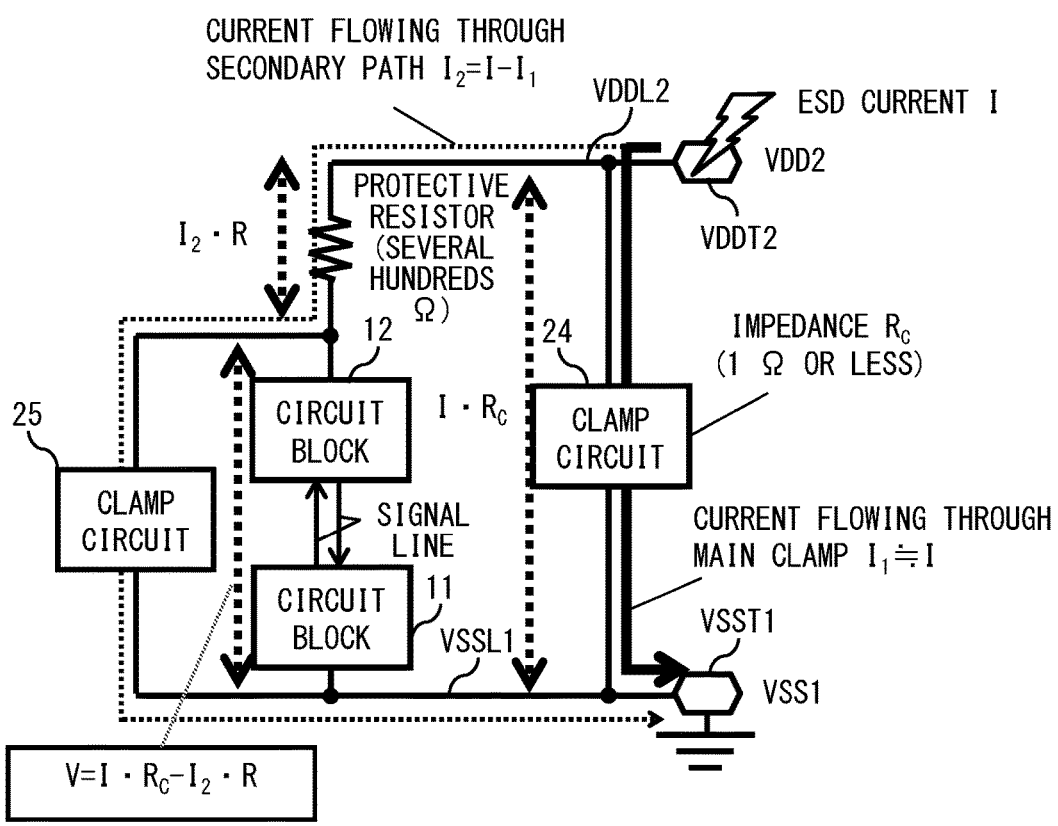
FIG. 4B is a drawing showing an operation of the semiconductor chip according to the first embodiment.

Although only one main path is illustrated in FIG. 4B to simplify the description, the path passing through the power supply voltage line VDDL2, the clamp circuit 24, the reference voltage line VSSL2, the clamp circuit 23, and the reference voltage line VSSL1 also functions as a main path. An impedance of this path (a total impedance of the clamp circuit 23 and the clamp circuit 24) is also a low impedance of less than or equal to 1Ω. Although the example in which these two main paths are included has been explained so far, only one of the main paths may be included.

Advantages of First Embodiment

As described above, the semiconductor chip 1 according to the first embodiment includes the first circuit block 11 that is connected between the first power supply voltage line VDDL1 and the first reference voltage line VSSL1 and the second circuit block 12 that is connected between the second power supply voltage line VDDL2 and the second reference voltage line VSSL2 and transmits and receives signals with the first circuit block 11. The semiconductor chip 1 further includes a first clamp circuit(s) (the clamp circuit 22 or the clamp circuits 23 and 24) that is connected between the second power supply voltage line VDDL2 and the first reference voltage line VSSL1 and clamps a potential difference between the second power supply line VDDL2 and the first reference voltage line VSSL1. The semiconductor chip 1 further includes a resistor circuit that is connected between the second power supply voltage line VDDL2 and the second circuit block 12 and includes a resistance value that is greater than an impedance of the first clamp circuit when ESD is applied. The semiconductor chip 1 further includes the second clamp circuit 25 that is connected between the line (internal line) VDDML connected between the resistor circuit and the second circuit block 12 and the first reference voltage line VSSL1 and clamps a potential difference between the internal line VDDML and the first reference voltage line VSSL1.

With such a configuration, the following advantages described in (1) to (3) can be achieved.

(1) It is possible to prevent the potential difference generated in the different power supply crossing part when ESD is applied thereto from rising by the secondary discharge path that includes the second clamp circuit 25 that is formed for the different power supply crossing part. That is, as ESD resistance is improved by the secondary discharge path, an increase in the size of the first clamp circuit in the main discharge path is unnecessary. It is thus possible to improve the ESD withstand voltage (mainly the CDM withstand voltage) without increasing the sizes of the clamp circuits 21 to 24.

(2) As elements to be added (the clamp circuit 25 and the protective resistor) are small, addition of the elements will hardly contribute to an increase in an area of an analog IP region. For example, as a current flowing through the second clamp circuit 25 will be a small current (e.g., about several tens to several mA) because of a resistance ratio between the first clamp circuit (e.g., less than or equal to 1Ω) and the protective resistor (e.g., several hundreds Ω), the size of the second clamp circuit 25 may be small enough for such a small current to flow therethrough.

(3) When the clamp circuit is directly connected to the signal line that transmits the different power supplies signals, a signal characteristic may deteriorate due to an increase in a capacitance added to the signal line (especially in the case of high-speed signals). On the other hand, in the first embodiment, as a clamp circuit is not connected to the signal line that transmits the different power supply crossing signals, and the clamp circuit 25 is connected to the power supply line, the signal characteristic will deteriorate.

As described above, according to the first embodiment, it is possible to improve ESD resistance while preventing a cost of a semiconductor device (the semiconductor chip 1) from rising.

Second Embodiment

Configuration of Second Embodiment

Figure 5:
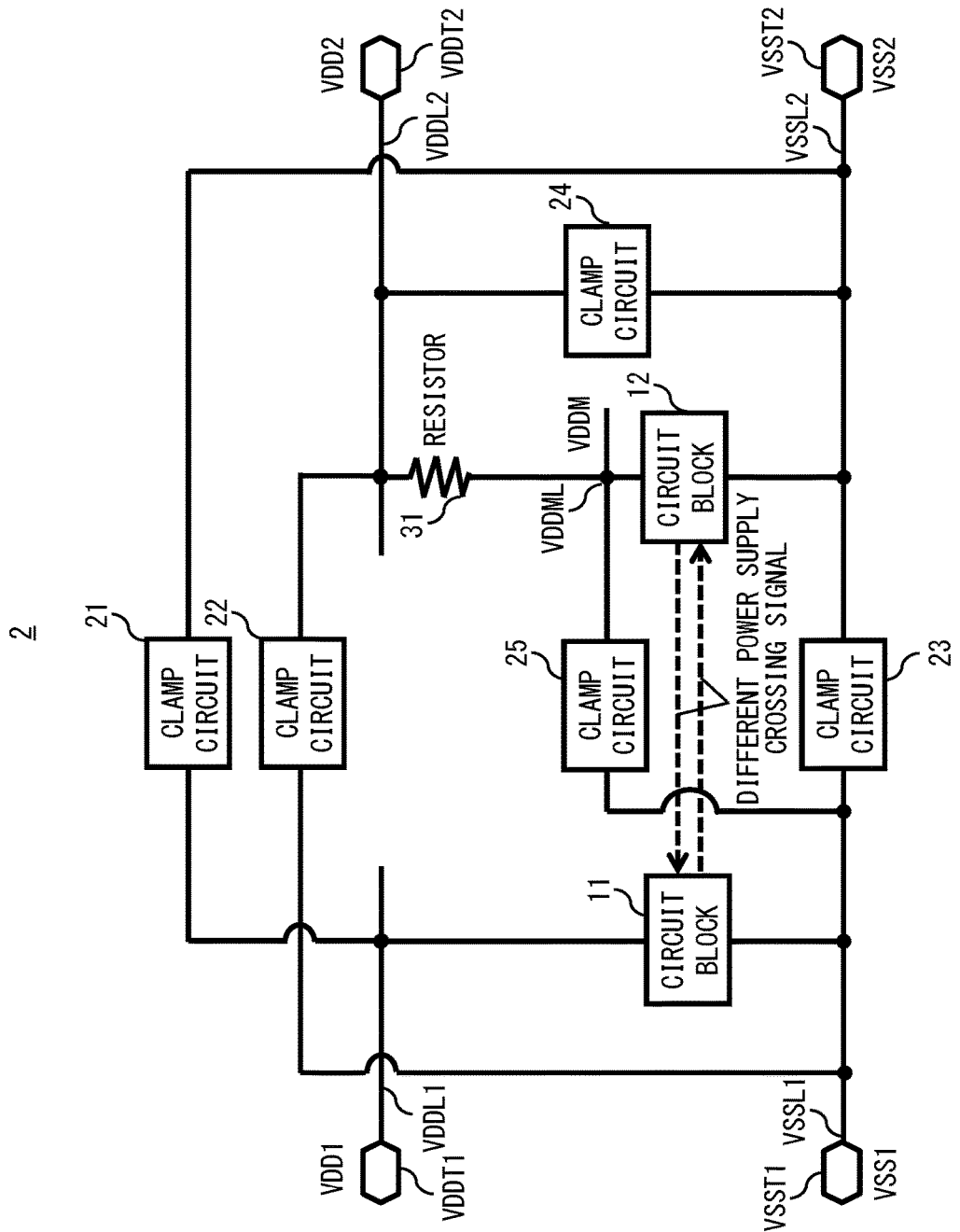
FIG. 5 is a drawing showing a circuit configuration of a semiconductor chip according to a second embodiment.

Next, a second embodiment will be described. A circuit configuration of a semiconductor chip 2 according to the second embodiment will be described with reference to FIG. 5. As shown in FIG. 5, a difference between the semiconductor chip 2 according to the second embodiment and the semiconductor chip 1 according to the first embodiment shown in FIG. 1 is that the semiconductor chip 2 according to the second embodiment does not include the regulator 32.

Operation of Second Embodiment

As an operation of the semiconductor chip 2 according to the second embodiment is the same as that of the semiconductor chip 1 according to the first embodiment that has been described with reference to FIG. 4B, a description thereof will be omitted.

Advantages of Second Embodiment

As the advantages of the second embodiment are the same as those of the first embodiment, descriptions thereof will be omitted. That is, both of the resistor 31 and the regulator 32 may not be used and instead a resistance value of the resistor 31 may be used as a resistance value of a protective resistance that reduces a potential difference generated in a different power supply crossing part.

Third Embodiment

Configuration of Third Embodiment

Figure 6:
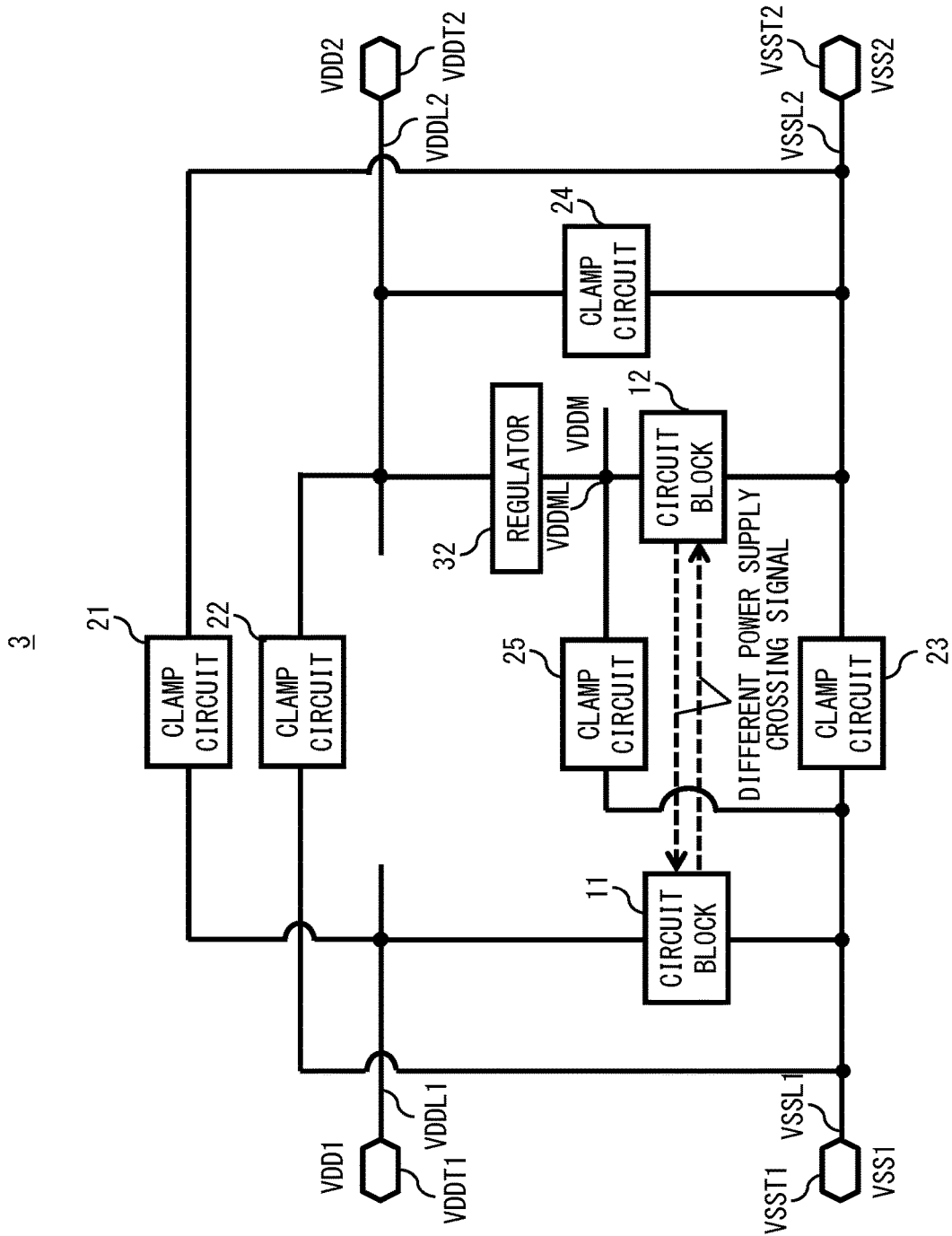
FIG. 6 is a drawing showing a circuit configuration of a semiconductor chip according to a third embodiment.

Next, a third embodiment will be described. A circuit configuration of a semiconductor chip 3 according to the third embodiment will be described with reference to FIG. 6. As shown in FIG. 6, a difference between the semiconductor chip 3 according to the third embodiment and the semiconductor chip 1 according to the first embodiment shown in FIG. 1 is that the semiconductor chip 3 according to the third embodiment does not include the resistor 31.

Operation of Third Embodiment

As an operation of the semiconductor chip 3 according to the third embodiment is the same as that of the semiconductor chip 1 according to the first embodiment that has been described with reference to FIG. 4B, a description thereof will be omitted.

Advantages of Third Embodiment

As the advantages of the third embodiment are the same as those of the first embodiment, descriptions thereof will be omitted. That is, both of the resistor 31 and the regulator 32 may not be used and instead a resistance value of the regulator 32 may be used as a resistance value of a protective resistance that reduces a potential difference generated in a different power supply crossing part.

Fourth Embodiment

Configuration of Fourth Embodiment

Figure 7:
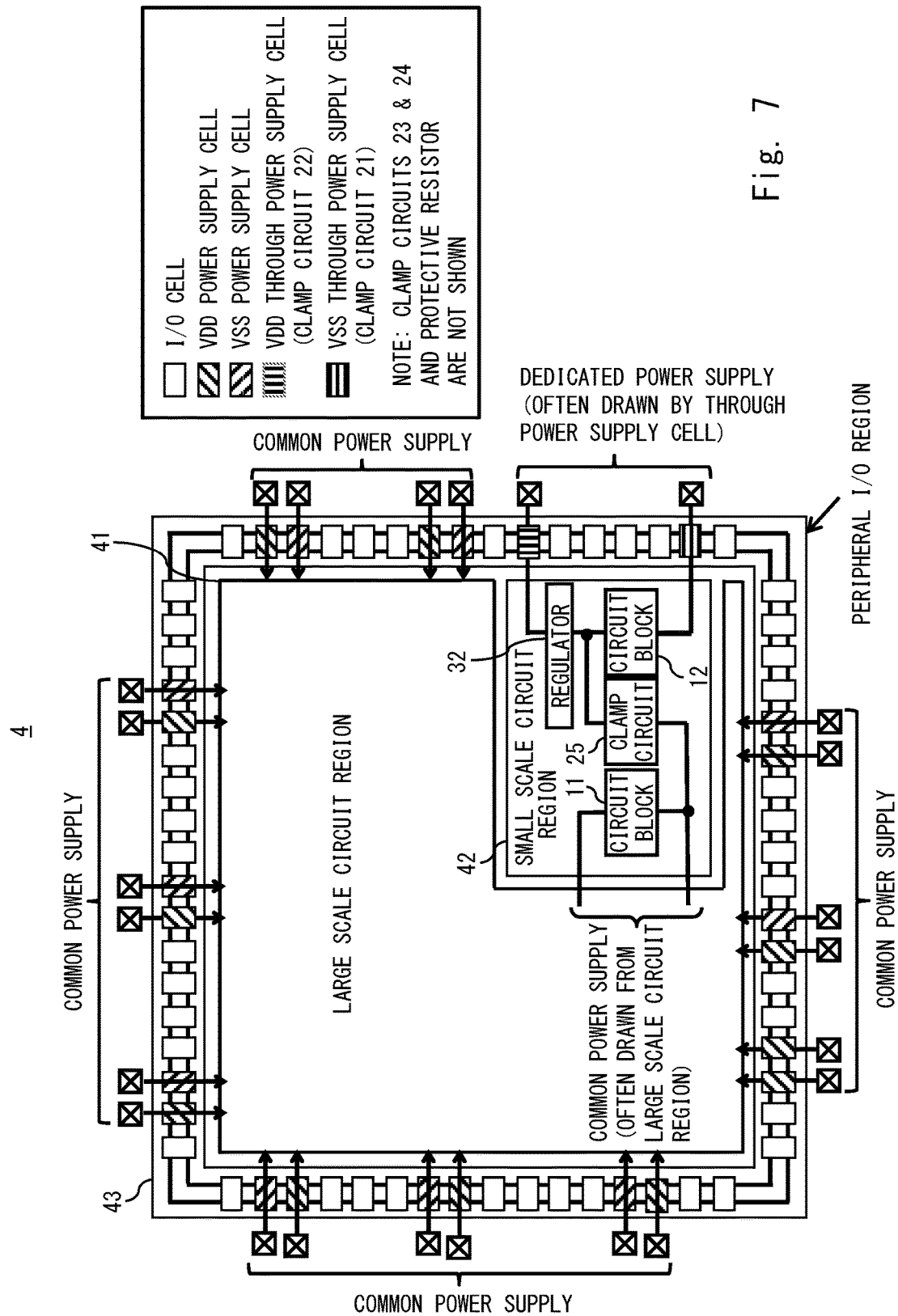
FIG. 7 is a drawing showing a layout image of a whole semiconductor chip according to a fourth embodiment.

Next, a fourth embodiment will be described. A layout of respective regions of a semiconductor chip 4 according to the fourth embodiment will be described with reference to FIG. 7. As shown in FIG. 7, the semiconductor chip 4 according to the fourth embodiment includes a large scale circuit region 41, a small scale circuit region 42, and a peripheral I/O region 43. The semiconductor chip 4 is roughly divided into an internal region and a peripheral I/O region 43. That is, the large scale circuit region 41 and the small scale circuit region 42 are included in the internal region.

Sizes of circuits included in the large scale circuit region 41 are greater than sizes of circuits included in the small scale circuit region 42. The small size circuit region 42 includes the circuit blocks 11 and 12, the clamp circuit 25, the regulator 32, and the like.

The peripheral I/O region 43 includes a plurality of I/O cells, a plurality of VDD power supply cells, a plurality of VSS power supply cells, a VDD through power supply cell, and a VSS through power supply cell.

The power supply voltage VDD1 and the reference voltage VSS1 are supplied from the outside to the semiconductor chip 4 as common power supplies. Each of the plurality of VDD power supply cells draws the power supply voltage VDD1 from the outside and supplies it to the respective circuits in the large scale circuit region 41. Each of the plurality of VSS power supply cells draws the power supply voltage VSS1 from the outside and supplies it to the respective circuits in the large scale circuit region 41.

The power supply voltage VDD2 and the reference voltage VSS2 are supplied from the outside to the semiconductor chip 4 as dedicated power supplies. The VDD through power supply cell draws the power supply voltage VDD2 from the outside and supplies it to the respective circuits inside the small scale circuit region 42. The VSS through power supply cell draws the power supply voltage VSS2 from the outside and supplies it to the respective circuits inside the small scale circuit region 42.

The VDD power supply cells include a power supply voltage terminal VDDT1. The VSS power supply cells include the reference voltage terminal VSST1. The VDD through power supply cell includes the clamp circuit 22 (not shown) and the power supply voltage terminal VDDT2. The VSS through power supply cell includes the clamp circuit 21 (not shown) and the reference voltage terminal VSST2.

However, the common power supplies (the power supply voltage VDD1 and the reference voltage VSS1) that are drawn through the large scale circuit region 41 are supplied to the circuit block 11 inside the small scale circuit region 42. That is, the small scale circuit region 42 includes a common power supply region that includes circuits such as the circuit block 11 and the like that operate according to the common power supplies and a dedicated power supply region that includes circuits such as the circuit block 12 and the like that operate according to the dedicated power supply.

Note that in FIG. 7, although an example in which the VDD through power supply cell and the VSS through power supply cell are disposed inside the peripheral I/O region 43 is shown, it is not limited to this. The VDD through power supply cell and the VSS power supply cell may be disposed proximate to the small scale circuit region 42 inside the internal region of the semiconductor chip 4 (i.e., outside the large scale circuit region 41, the small scale circuit region 42, and the peripheral I/O region 43) or may be disposed inside the small scale circuit region 42.

Figure 8:
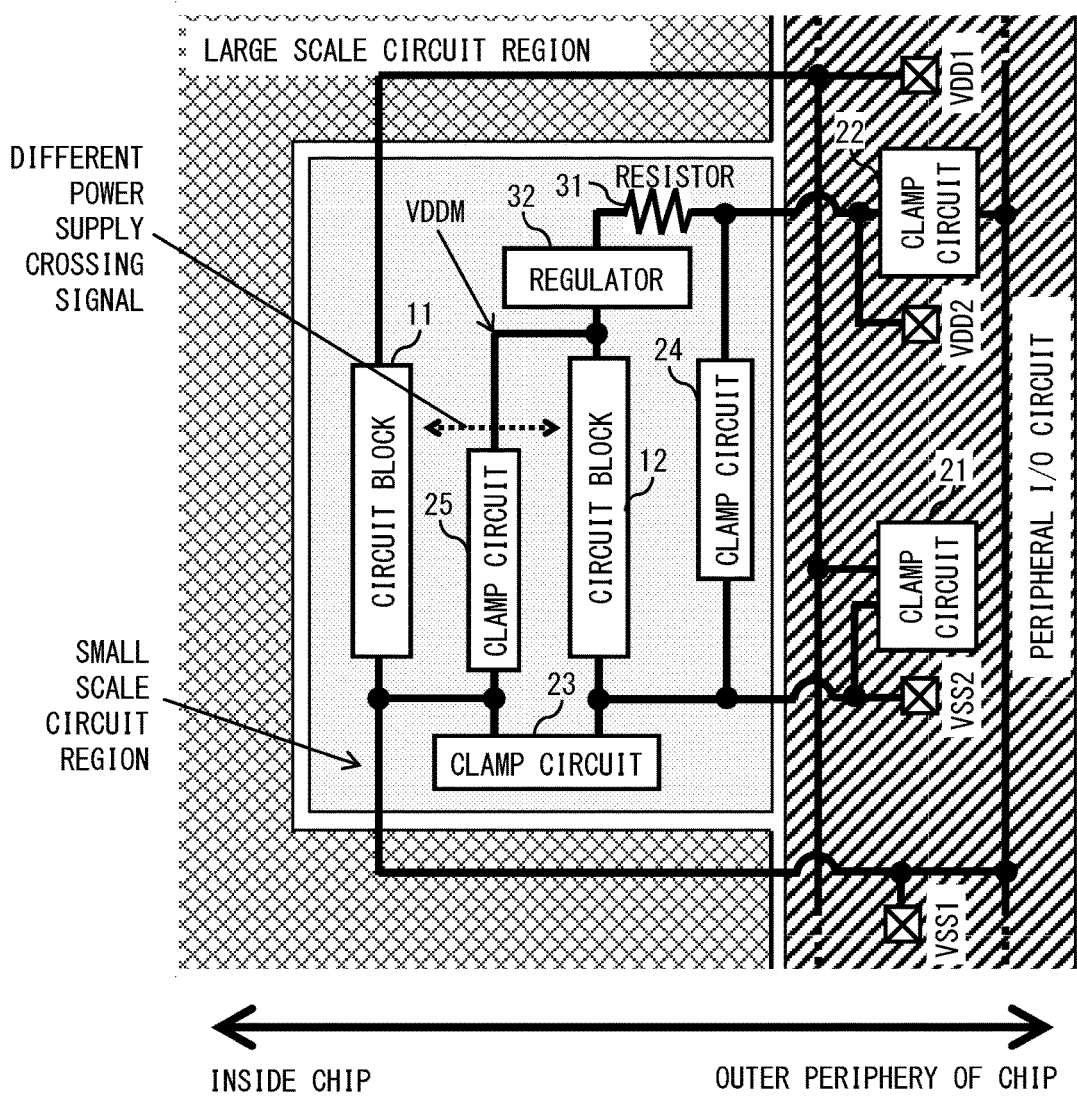
FIG. 8 is a drawing showing a layout image of respective circuits inside the semiconductor chip according to the fourth embodiment.

Next, a layout of the respective circuits 11, 12, 21 to 25, 31, and 32 on the semiconductor chip 4 according to the fourth embodiment will be described with reference to FIG. 8. As shown in FIG. 8, the circuit blocks 11 and 12, the clamp circuits 23 to 25, the resistor 31, and the regulator 32 are included in the small scale circuit region 42. The clamp circuits 21 and 22, the power supply voltage terminals VDDT1 and VDDT2, and the reference voltage terminal VSST1 and VSST2 are included in the peripheral I/O region.

As shown in FIG. 8, the large scale circuit region 41 and the small scale circuit region 42 are disposed on a side closer to an inside of the semiconductor chip 1, and the peripheral I/O region 43 is disposed on a side closer to an outer periphery of the semiconductor chip 1.

Operation of Fourth Embodiment

As an operation of the semiconductor chip 4 according to the fourth embodiment is the same as that of the semiconductor chip 1 according to the first embodiment that has been described with reference to FIG. 4B, a description thereof will be omitted.

Advantages of Fourth Embodiment

In regard to the advantages of the fourth embodiment, the parts of the descriptions that are common to the description of the first embodiment will be omitted. As described above, in a semiconductor chip on which large and small circuits are mounted and that supplies different power supplies to the large and small circuits, respectively, there is a problem that a CDM breakdown is likely to occur in a different power supply crossing part between the large and small circuits due to factors such as a difference in package capacities that are added to the respective power supply regions at the time of a CDM test and the like.

To address this problem, in addition to the configuration of the semiconductor chip 1 according to the first embodiment, in the semiconductor chip 4 according to the fourth embodiment, the first power supply voltage line VDDL1 and the first reference voltage line VSSL1 supply the first power supply voltage VDD1 and the first reference voltage VSS1, respectively, to the large scale circuit. Further, in the semiconductor chip 4 according to the fourth embodiment, the second power supply voltage line VDDL2 and the second reference voltage line VSSL2 supply the second power supply voltage VDD2 and the second reference voltage VSS2, respectively, to the small scale circuit that is smaller than the large scale circuit.

That is, according to the fourth embodiment, in the semiconductor chip 4 in which the different power supply crossing part can easily break down by a CDM test, ESD resistance in the different power supply crossing part is improved. Thus, according to the fourth embodiment, ESD resistance can be preferably improved.

It is obvious that in a manner similar to the second embodiment, in the fourth embodiment, the semiconductor chip 4 may be configured to include one of the resistor 31 and the regulator 32.

Fifth Embodiment

Configuration of Fifth Embodiment

Figure 9:
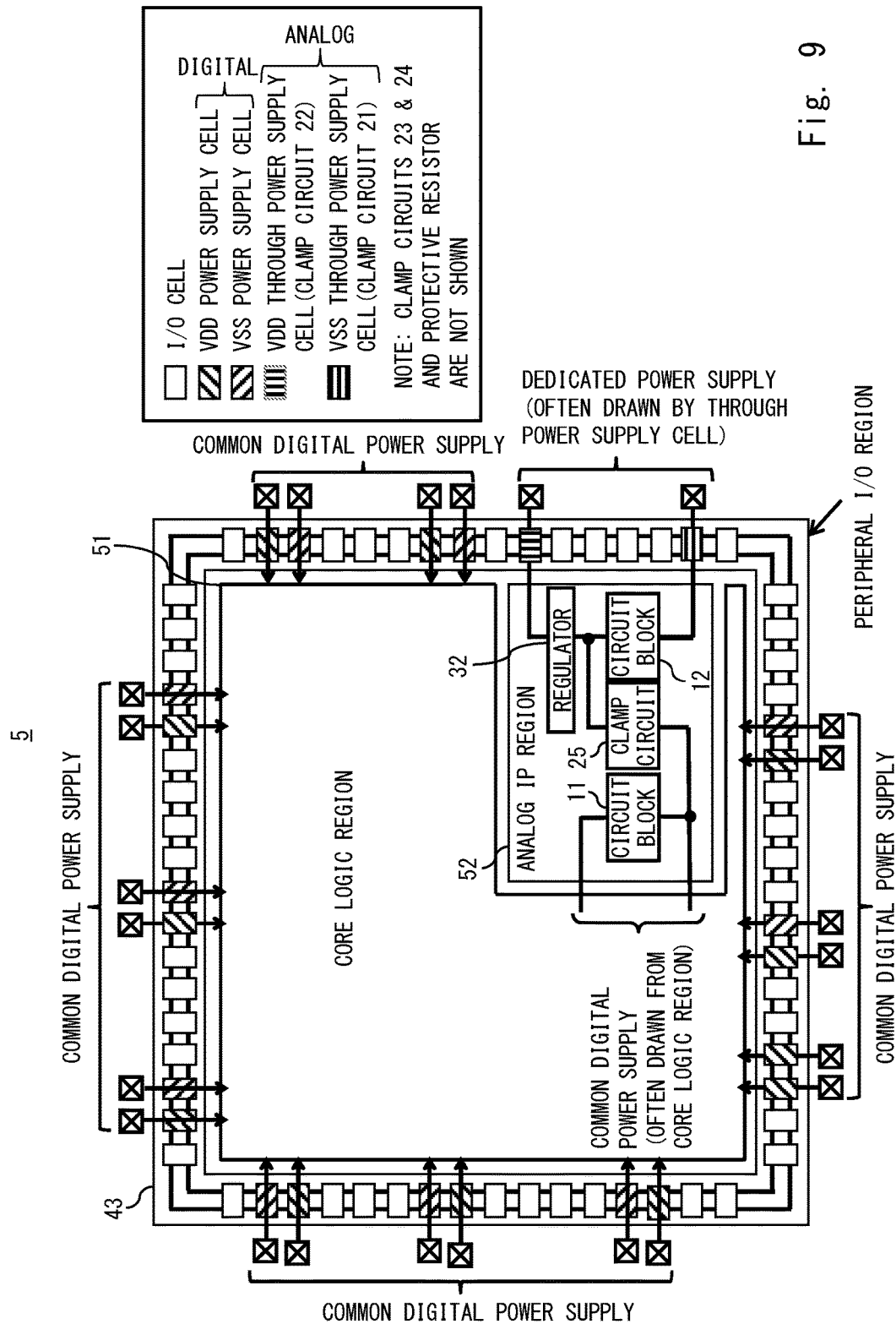
FIG. 9 is a drawing showing a layout image of a whole semiconductor chip according to a fifth embodiment.

Next, a fifth embodiment will be described. As shown in FIG. 9, a semiconductor chip 5 according to the fifth embodiment clearly shows that in the semiconductor chip 4 according to the fourth embodiment shown in FIG. 7, the large scale circuit region 41 is a core logic region 51, and the small scale circuit region 42 is an analog IP region 52. That is, the large scale circuit included in the core logic region 51 is a digital circuit, and the small scale circuit included in the analog IP region 52 is an analog circuit. A power supply for the digital circuit is supplied to the core logic region 51 as a common power supply (hereinafter referred to as a "common digital power supply"), and a power supply for the analog circuit is supplied to the analog IP region 52 as a dedicated power supply.

That is, the analog IP region 52, which has been explained as the small scale circuit region 42 in the fourth embodiment, includes a common digital power supply region that includes the circuits such as the circuit block 11 and the like operating according to the common digital power supply and the dedicated power supply region that includes the circuits such as the circuit block 12 and the like operating according to the dedicated power supply. In this way, the power supply region of the analog IP region is often divided into the common digital power supply region and the dedicated power supply region. The common digital power supply is often supplied by drawing a power supply from the core logic region 51, and the dedicated power supply is often supplied from the outside via the VDD through power supply cell and the VSS through power supply cell, which is dedicated for the analog circuit.

With such a configuration, for example, the circuit blocks 11 and 12 function as a converter that converts analog signals into digital signals. The circuit block 12 obtains an analog signal indicating a result of measurement from an external sensor and outputs the analog signal to the circuit block 11 as the different power supply crossing signal. The circuit block 11 converts the analog signal obtained as the different power supply crossing signal into a digital signal and outputs the digital signal to the digital circuit inside the core logic region 51. Then, the digital circuit inside the core logic region 51 can execute processes according to the result of measurement by the sensor.

Operation of Fifth Embodiment

As an operation of the semiconductor chip 5 according to the fifth embodiment is the same as that of the semiconductor chip 1 according to the first embodiment that has been described with reference to FIG. 4B, a description thereof will be omitted.

Advantages of Fifth Embodiment

In regard to the advantages of the fifth embodiment, the parts of the descriptions that are common to the description of the first embodiment will be omitted. As described above, in most cases, a requested size of the analog circuit is smaller than that of the digital circuit. On the other hand, in the semiconductor chip 5 according to the fifth embodiment, in addition to the configuration of the semiconductor chip 4 according to the fourth embodiment, it has been explained that the large scale circuit is the digital circuit, and the small scale circuit is the analog circuit. That is, according to the fifth embodiment, ESD resistance of a different power supply crossing part is improved on the semiconductor chip 5 on which the different power supply crossing part between the large and small scale circuits tends to be formed, which easily breaks down by a CDM test. Thus, according to the fifth embodiment, ESD resistance can be preferably improved.

Other Embodiment

Although in the above first to fifth embodiments, an example in which the clamp circuit 25 has the circuit configuration shown in FIG. 3 has been explained, it is not limited to this. For example, any one of the following elements (1) to (6) may be used as the clamp circuit 25. (NMOS transistor: W size several um to several tens um)

(1) Type 1

Figure 10A:
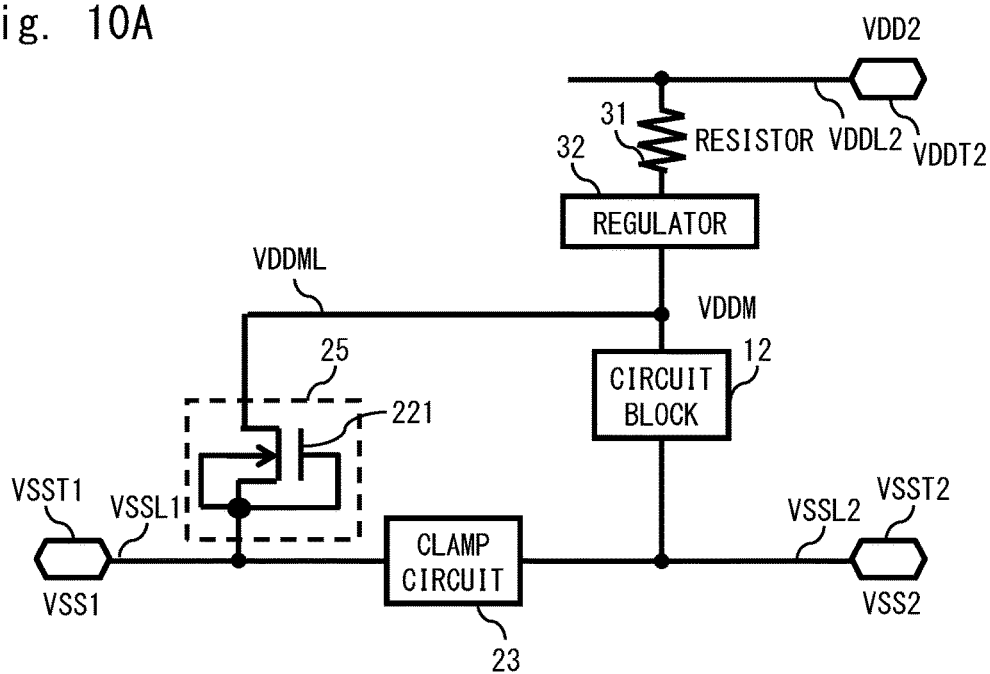
FIG. 10A is a drawing showing a first circuit configuration of a clamp circuit (NMOS) according to other embodiments.

In this example, as shown in FIG. 10A, the clamp circuit 25 includes an NMOS transistor 221. As for the NMOS transistor 221, the drain is connected to the internal line VDDML, and the source, the gate, and the well are connected to the reference voltage line VSSL1.

With this configuration, for example, when a positive polarity surge voltage is applied to the power supply voltage line VDDL2, the voltage of the internal line VDDML increases. Then, when a parasitic bipolar transistor of the NMOS transistor 221 is turned on, a surge current is discharged from the internal line VDDML to the reference voltage line VSSL1, and a potential difference between the internal line VDDML and the reference voltage line VSSL1 can be clamped.

(2) Type 2

Figure 10B:
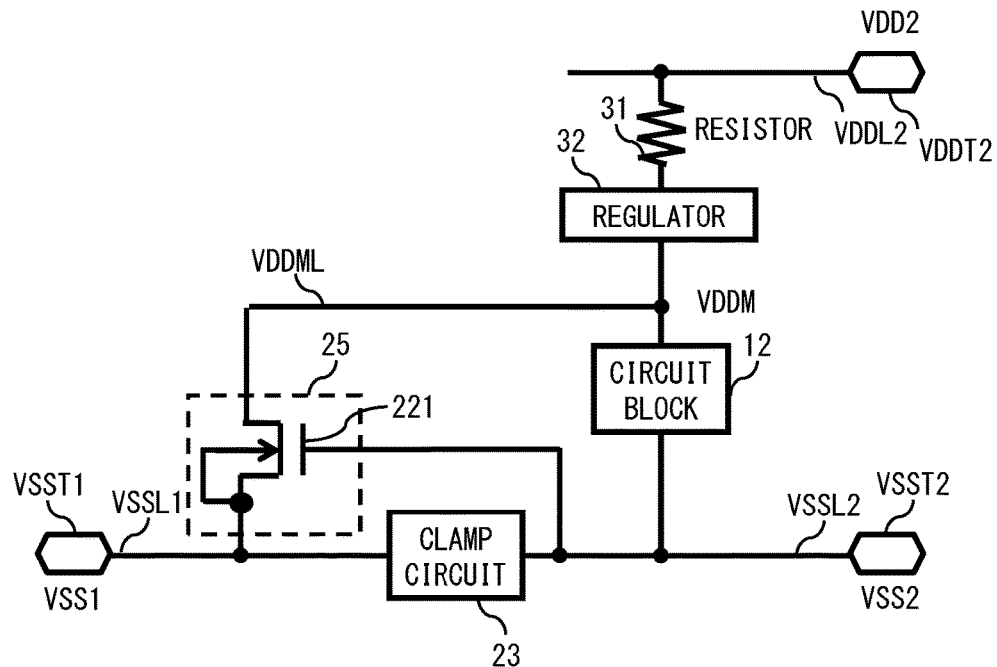
FIG. 10B is a drawing showing a second circuit configuration of the clamp circuit (NMOS) according to other embodiments.

In this example, as shown in FIG. 10B, the clamp circuit 25 includes an NMOS transistor 221. As for the NMOS transistor 221, the drain is connected to the internal line VDDML, the source and the well are connected to the reference voltage line VSSL1, and the gate is connected to the reference voltage line VSSL2.

With this configuration, for example, when a positive polarity surge voltage is applied to the power supply voltage line VDDL2, a surge current is discharged to the reference voltage line VSSL2 by the clamp circuit 24, and then a voltage of the reference voltage line VSSL2 increases. That is, the gate voltage of the NMOS transistor 221 increases. The NMOS transistor 221 is turned on, the surge current is discharged from the internal line VDDML to the reference voltage line VSSL1, so that the potential difference between the internal line VDDML and the reference voltage line VSSL1 can be clamped.

(3) Type 3

Figure 10C:
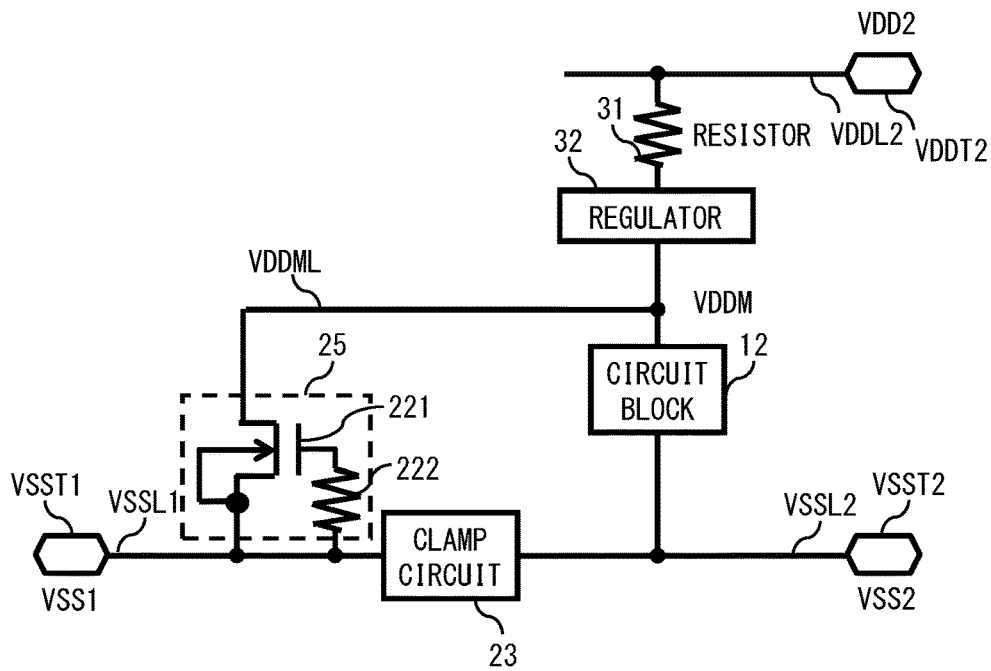
FIG. 10C is a drawing showing a third circuit configuration of the clamp circuit (NMOS) according to another embodiment.

In this example, as shown in FIG. 10C, the clamp circuit 25 includes a NMOS transistor 221 and a resistor 222. As for the NMOS transistor 221, the drain is connected to the internal line VDDML, the source and the well are connected to the reference voltage line VSSL1, and the gate is connected to the reference voltage line VSSL1 with the resistor 222 (several tens kΩ to several hundreds kΩ) interposed therebetween.

With this configuration, for example, when a positive polarity surge voltage is applied to the power supply voltage line VDDL2, the voltage of the internal line VDDML increases, and a displacement current caused by a drain-gate parasitic capacitance is passed from the drain to the gate of the NMOS transistor 221. As the displacement current is passed from the gate to the reference voltage line VSSL1 via the resistor 222, the gate voltage increases to be greater than the source voltage. Then, the NMOS transistor 221 is turned on, a surge current is discharged from the internal line VDDML to the reference voltage line VSSL1, and a potential difference between the internal line VDDML and the reference voltage line VSSL1 can be clamped.

(PMOS transistor: W size several um to several tens um)

(1) Type 1

Figure 11A:
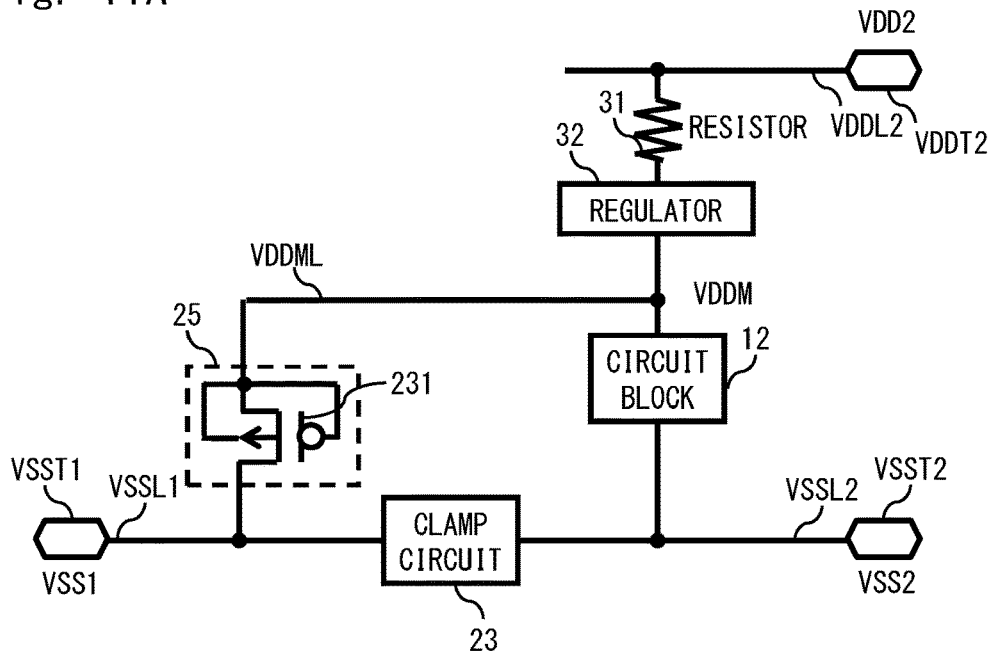
FIG. 11A is a drawing showing a first circuit configuration of a clamp circuit (PMOS) according to other embodiments.

In this example, as shown in FIG. 11A, the clamp circuit 25 includes a PMOS transistor 231. As for the PMOS transistor 231, the drain is connected to the reference voltage line VSSL1, the source, the gate, and the well are connected to the internal line VDDML.

With this configuration, for example, when a positive polarity surge voltage is applied to the power supply voltage line VDDL2, the voltage of the internal line VDDML increases. Then, when a parasitic bipolar transistor of the PMOS transistor 231 is turned on, a surge current is discharged from the internal line VDDML to the reference voltage line VSSL1, and then a potential difference between the internal line VDDML and the reference voltage line VSSL1 can be clamped.

(2) Type 2

Figure 11B:
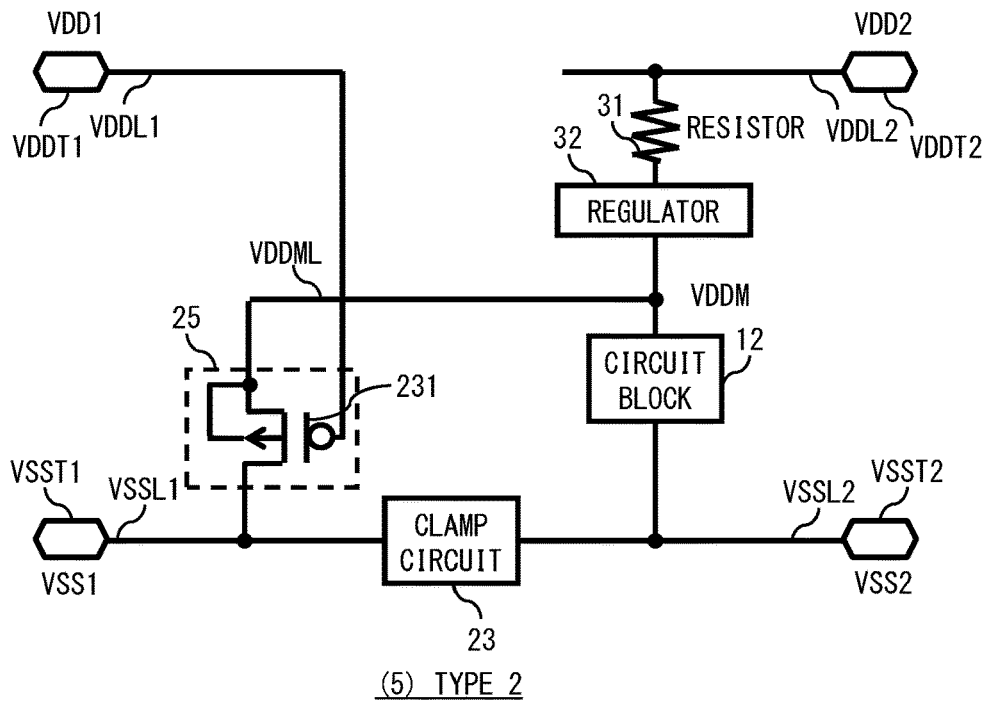
FIG. 11B is a drawing showing a second circuit configuration of the clamp circuit (PMOS) according to other embodiments.

In this example, as shown in FIG. 11B, the clamp circuit 25 includes a PMOS transistor 231. As for the PMOS transistor 231, the drain is connected to the reference voltage line VSSL1, the source and the well are connected to the internal line VDDML, and the gate is connected to the power supply voltage line VDDL1.

With this configuration, for example, when a positive polarity surge voltage is applied to the power supply voltage line VDDL2, the voltage of the internal line VDDML increases. That is, the source voltage of the PMOS transistor 231 increases. When ESD is applied, the power supply voltage line VDDL1 to which the gate of the PMOS transistor 231 is connected has a potential that is increased for a parasitic diode present inside the circuit block 11 in a forward direction as compared to a potential of the reference voltage line VSSL1. Therefore, a potential of the gate becomes lower than the source. Then, the PMOS transistor 231 is turned on, a surge current is discharged from the internal line VDDML to the reference voltage line VSSL1, and a potential difference between the internal line VDDML and the reference voltage line VSSL1 can be clamped.

(3) Type 3

Figure 11C:
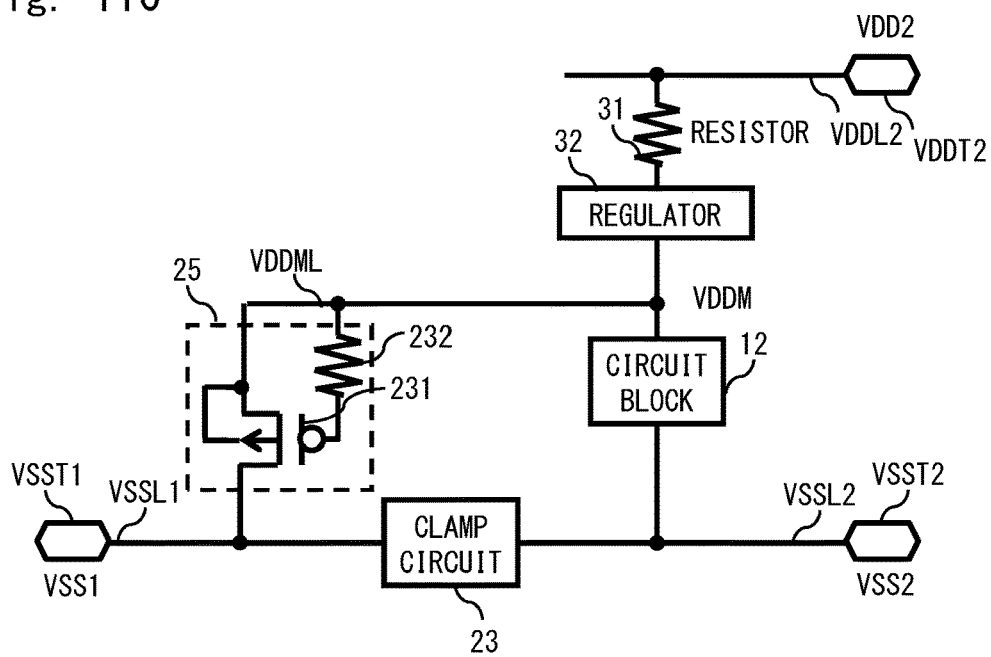
FIG. 11C is a drawing showing a third circuit configuration of the clamp circuit (PMOS) according to other embodiments.

In this example, as shown in FIG. 11C, the clamp circuit 25 includes a PMOS transistor 231 and a resistor 232. As for the PMOS transistor 231, the drain is connected to the reference voltage line VSSL1, the source and the well are connected to the internal line VDDML, and the gate is connected to the internal line VDDML with the resistor 232 (several tens kΩ to several hundreds kΩ) interposed therebetween.

With this configuration, for example, when a positive polarity surge voltage is applied to the power supply voltage line VDDL2, the voltage of the internal line VDDML increases, a displacement current caused by a parasitic capacitance is passed from the gate to the drain of the PMOS transistor 231, and the gate voltage is reduced to be smaller than the source voltage. Then, the PMOS transistor 231 is turned on, and a surge current is discharged from the internal line VDDML to the reference voltage line VSSL1 so that a potential difference between the internal line VDDML and the reference voltage line VSSL1 can be clamped.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a first circuit block that is connected between a first power supply voltage line and a first reference voltage line;
   a second circuit block that is connected between a second power supply voltage line and a second reference voltage line and transmits and receives signals with the first circuit block;
   a resistor circuit that is connected between the second power supply voltage line and the second circuit block; and
   a first clamp circuit that is connected between a line connected between the resistor circuit and the second circuit block and the first reference voltage line and clamps a potential difference between the line connected between the resistor circuit and the second circuit block and the first reference voltage line.

2. The semiconductor device according to claim 1, further comprising:
   a second clamp circuit that is connected between the second power supply voltage line and the second reference voltage line and clamps a potential difference between the second power supply voltage line and the second reference voltage line.

3. The semiconductor device according to claim 1, further comprising:
   a third clamp circuit that is connected between the second reference voltage line and the first reference voltage line and clamps a potential difference between the second reference voltage line and the first reference voltage line.

4. The semiconductor device according to claim 1, wherein the resistor circuit includes a resistor.

5. The semiconductor device according to claim 1, wherein the resistor circuit includes a regulator.

6. The semiconductor device according to claim 1, wherein
   the first power supply voltage line and the first reference voltage line supply a first power supply voltage and a first reference voltage, respectively, to a large scale circuit in the semiconductor device, and
   the second power supply voltage line and the second reference voltage line supply a second power supply voltage and a second reference voltage, respectively, to a small scale circuit that is smaller than the large scale circuit in the semiconductor device.

7. The semiconductor device according to claim 6, wherein
   the large scale circuit is a digital circuit, and
   the small scale circuit is an analog circuit.

8. The semiconductor device according to claim 1, wherein the first clamp circuit is a bidirectional diode.

9. The semiconductor device according to claim 8, wherein
   the bidirectional diode includes a plurality of diodes that are connected in series,
   an anode of each of the plurality of diodes is connected to a side closer to the line connected between the resistor circuit and the second circuit block, and a cathode of each of the plurality of diodes is connected to a side closer to the first reference voltage line, and
   the number of the plurality of diodes is determined so that thresholds of the respective plurality of diodes multiply by the number of the plurality of diodes will not be lower than a potential difference between a normal voltage value of the line connected between the resistor circuit and the second circuit block and a normal voltage value of the first reference voltage line.

10. The semiconductor device according to claim 1, further comprising:
   a fourth clamp circuit that is connected between the second reference voltage line and the first power supply voltage line and clamps a potential difference the first power supply voltage line and the second reference voltage line.

11. The semiconductor device according to claim 10, wherein the first clamp circuit is disposed on the inside of the semiconductor device than the fourth clamp circuit.

12. The semiconductor device according to claim 1, wherein the first clamp circuit is disposed on the small scale circuit region in the semiconductor device.

13. The semiconductor device according to claim 10, wherein the fourth clamp circuit is disposed on a peripheral I/O region in the semiconductor device.

14. The semiconductor device according to claim 1, further comprising:
   a fifth clamp circuit that is connected between the second power supply voltage line and the first reference voltage line and clamps a potential difference between the second power supply voltage line and the first reference voltage line.

15. The semiconductor device according to claim 14, wherein the fifth clamp circuit is disposed on a peripheral I/O region in the semiconductor device.

* * * * *